United States Patent
Allan et al.

(10) Patent No.: US 6,765,717 B2
(45) Date of Patent: Jul. 20, 2004

(54) PREFERRED CRYSTAL ORIENTATION OPTICAL ELEMENTS FROM CUBIC MATERIALS

(75) Inventors: Douglas C. Allan, Corning, NY (US); Nicholas F. Borrelli, Elmira, NY (US); Charlene M. Smith, Corning, NY (US); Bryan D. Stone, Tucson, AZ (US)

(73) Assignee: Corning Incorporated, Corning, NY (US)

( * ) Notice: Subject to any disclaimer, the term of this patent is extended or adjusted under 35 U.S.C. 154(b) by 22 days.

(21) Appl. No.: 10/146,761

(22) Filed: May 15, 2002

(65) Prior Publication Data

US 2003/0067679 A1 Apr. 10, 2003

Related U.S. Application Data

(60) Provisional application No. 60/291,424, filed on May 16, 2001.

(51) Int. Cl.[7] .................................................. G02B 5/08
(52) U.S. Cl. ...................................................... 359/350
(58) Field of Search ................................. 359/350, 351, 359/352, 353, 354, 355, 642, 722; 501/3, 40, 900; 428/696, 469, 697; 430/321, 490; 423/263, 21, 185, 463, 464

(56) References Cited

U.S. PATENT DOCUMENTS

| | | |
|---|---|---|
| 2,498,186 A | 2/1950 | Stockbarger et al. |
| 2,550,173 A | 4/1951 | Swinehart et al. |
| 3,766,080 A | 10/1973 | Swinehart et al. |
| 3,769,230 A | 10/1973 | Robinson et al. |
| 3,959,442 A | 5/1976 | Pastor et al. |
| 4,038,201 A | 7/1977 | Hargreaves |
| 4,048,514 A | 9/1977 | Haussuehl et al. |
| 4,053,572 A | 10/1977 | Moss et al. |

(List continued on next page.)

FOREIGN PATENT DOCUMENTS

| | | |
|---|---|---|
| DE | 1 291 321 | 3/1969 |
| DE | 222 426 A1 | 5/1998 |
| EP | 0 875 778 A1 | 11/1998 |
| EP | 0 942 297 | 9/1999 |
| EP | 1 006 373 A2 | 6/2000 |

(List continued on next page.)

OTHER PUBLICATIONS

"Growth and Properties of Scintillating Crystals BaF2," Jiang et al., Journal of Crystal Growth, vol. 79, No. 1–3, Dec. 1986, pp. 720–722.

(List continued on next page.)

Primary Examiner—Mohammad Sikder
(74) Attorney, Agent, or Firm—Walter M. Douglas

(57) ABSTRACT

The invention provides a method of making a <194 nm wavelength calcium fluoride crystal optical lithography element for transmitting wavelengths less than about 194 nm along an optical axis with minimal birefringence by providing an optical element optical calcium fluoride crystal with an input face {100} crystal plane and forming the input face {100} crystal plane into an optical lithography element surface of an optical lithography element having an optical axis, with the optical axis aligned with a <100> crystal direction of the optical calcium fluoride crystal. In a preferred embodiment, the below 194 nm transmitting optical element is a <100>oriented calcium fluoride lens. In a preferred embodiment, the below 194 nm transmitting optical element is a <100> oriented calcium fluoride beam splitter.

20 Claims, 7 Drawing Sheets

U.S. PATENT DOCUMENTS

| | | | |
|---|---|---|---|
| 4,101,331 A | 7/1978 | Anderson | |
| 4,128,589 A | 12/1978 | Pastor et al. | |
| 5,000,548 A | 3/1991 | Mercado | |
| 5,039,858 A | 8/1991 | Anderson et al. | |
| 5,852,627 A | 12/1998 | Ershov | |
| 5,856,991 A | 1/1999 | Ershov | |
| 5,901,163 A | 5/1999 | Ershov | |
| 5,970,082 A | 10/1999 | Ershov | |
| 5,978,409 A | 11/1999 | Das et al. | |
| 5,982,800 A | 11/1999 | Ishihara et al. | |
| 6,069,749 A | 5/2000 | Omura | |
| 6,181,480 B1 | 1/2001 | Ito | |
| 6,201,634 B1 | 3/2001 | Sakuma et al. | |
| 6,298,080 B1 | 10/2001 | Heist et al. | |
| 6,309,461 B1 | 10/2001 | Gianoulakis et al. | |
| 6,342,312 B2 | 1/2002 | Oba et al. | |
| 6,377,338 B1 | 4/2002 | Suenaga | |
| 6,395,657 B2 | 5/2002 | Mayolet et al. | |
| 6,451,111 B1 | 9/2002 | Beall et al. | |
| 2001/0008540 A1 | 7/2001 | Oba et al. | 372/101 |
| 2002/0011202 A1 | 1/2002 | Gianoulakis et al. | |
| 2002/0102497 A1 | 8/2002 | Sparrow | |

FOREIGN PATENT DOCUMENTS

| | | |
|---|---|---|
| EP | 0 869 203 B1 | 8/2001 |
| EP | 1 130 419 A2 | 9/2001 |
| EP | 1 139 138 B1 | 10/2001 |
| JP | 09-315894 | 12/1997 |
| JP | 10[1998]-1310 | 1/1998 |
| JP | 10[1998]-59799 | 3/1998 |
| WO | 91/11734 | 8/1991 |
| WO | 0 942 297 A2 | 9/1999 |
| WO | 99/46836 | 9/1999 |
| WO | 00/75697 A1 | 12/2000 |
| WO | 01/01182 | 1/2001 |
| WO | 01/37052 A1 | 5/2001 |
| WO | 02/31232 | 4/2002 |

OTHER PUBLICATIONS

"Modern Optical Engineering–The Design of Optical Systems," Warren J. Smith, *Modern Opt Eng*, McGraw–Hill Book Company, 1996, Article: "Optical Materials and Coatings," pp 145–161; Article: "The Design of Optical Systems: General," pp 326–355.

U.S. Ser. No. 09/327,043, filed Jun. 7, 1999, Gianoulakis et al., Crystal Growth and Annealing Method and Apparatus, pp. 1–21.

OPTOVAC, Optical Crystal Handbook, Jan. 1993, pp. 1–41.

"Optical Characteristics of Large Single Crystals of Fluorides", Chernevskaya, E.G., et al., Opt. Technol. (USSR), Jun. 1973, vol. 40, No. 6 pp. 379–380.

Svetlto, O, Principles of Lasers:, $3^{rd}$ Ed., 1989, pp. 330–331.

Lambda Physik webpage: www.lambdaphysik.com/Microlithography/fullstory.asp?news_id=22, Lithography News, Lambda Physik Ships Fifth 157nm Lithography Laser, p. 1.

Lambda Physik webpage: www.lambdaphysik.com/Microlithography/novaline.asp, Novaline ® Lithography Series, pp. 1–2.

Lambda Physik webpage: www.lambdaphysik.com/Microlithography/mooreslaw.asp, Lithography—History, Moore's Law, pp. 1–3.

"Lambda Physik Fourth Annual 157nm/EUV Symposium" website: http://www.lambdaphysik.com/microlithography/157. (printed out 11/01).

Lambda Physik webpage: www.lambdaphysik.com/Microlithography/fullstory.asp, Lithography News, Lambda Physik Announces Breakthrough in 157 nm and F2 Lithography, pp. 1–2.

"Spatial Dispersion in the Dielectric Constant of GaAs," Yu et al., *Solid State Comm*, vol. 9, pp. 1421–1424, 1971.

"Technology at a Glance–Fall 2001," Website: http://www.nist.gov/public_affairs/taglance/tag01fall/fall2001.htm, pp 1–11.

"Semicon West 2001," Website: http://www.nist.gov/public_affairs/factsheet/semiconwest01.htm.

"Metrology Supporting Deep Ultraviolet Lithography." Website:http://www.eeel.nist.gov/810.0/lithography_deep-.html, published Jun. 2001, Ofc of Microelectronic Programs.

"Minimizing Spatial–dispersion–induced birefringence in crystals used for percision optics by using mixed crystals of materials with the opposite sign of the birefrigence." Website: http://physics.nist.gov/Divisions/Div842/Gp3/DUVMatChar/birefring.html. updated Aug. 1, 2001.

"The Trouble with Calcium Fluoride." *SPIEs oeMagazine*, pp 23–25, Mar. 2002.

"$Ca_{1-x}BA_xF_2$ and $Ca_{1-x}Sr_xF_2$ Mixed Crystals as potential solution to intrinsic birefringence problem for 157nm lithography," Burnett et al., *SEMATECH 157nm Tech Data Rev*, Dec. 11, 2001, NIST.

"Stress–Optical coefficients of 157nm Materials," Burnett et al., *SEMTECH 157nm Tech Data Rev*, Dec. 11, 2001, NIST.

"Intrinsic Birefringence in 157nm Materials," Burnett et al., *$2^{nd}$ Int'l Symposium on 157nm Lithography*, May 15, 2001, NIST.

NIST updates for Jul. 9, 2001, website: http://www.nist.gov/public_affairs/update/upd010709.htm, pp 1–8.

"Electron and Optical Physics Division" website: http://physics.nist.gov/TechAct/Div841/div841h.html, *Tech Activities 2001*, pp 1–9.

"Atomic Physics Division" website: http://physics.nist.gov/TechAct/Div842/div842h.html, *Tech Activities 2001*, pp 1–17.

"Plasma Radiation Group; DUV Sources and Materials Characterization" website: http://physics.nist.gov/Divisions/DIV 842/Gp3.DIVMatChar/index.html., pp 1–2.

"Absolute refractive indices amd thermal coefficients of fused silica and calcium fluoride near 193 nm," *Appl Optics*, vol. 37, No. 25, Sep. 1, 1998, pp 5964–5968.

"Intrinsic Birefringence in calcium fluoride and barium fluoride," *Phys Review B*, vol. 64, 241102(r), pp 1–4.

"Polarizability of Fluoride Ions in Fluorides with Fluorite–type structure" Sorokin, N.I., *Crystallography Reports*, vol. 45, No. 6, 2000, pp 976–978.

"Optical Anisotropy of Silicon Single Crystals" Pastrnak et al., *Phys Review B*, vol. 3, No. 8, Apr. 15, 1971, pp 2567–2571.

Barium Fluoride and Magnesium Fluoride Product Information, ISP Corp, www.ispoptics.com, Barium Fluoride Patinal product info, EM Industries, website: www.emicoe.com/barfluor.cfm.

"Materials Problem snags 157nm lithography" *EETimes* website: www.eetimes.com/story/OEG20010720S0106, Jul. 20, 2001, 4 pages.

"Industry Weighs shift to 157nm lithography" *EETimes* website: ww.eetimes.com/story/OEG20000518S0010, May 18, 2000, 4 pages.

PREFERRED CRYSTAL ORIENTATION OPTICAL ELEMENTS FROM CUBIC MATERIALS

This application claims the benefit of, and incorporates by reference, U.S. Provisional Application, 60/291,424 filed May 16, 2001 by N. F. Borrelli, D. C. Allan, C. M. Smith, and B. D. Stone entitled PREFERRED CRYSTAL ORIENTATION OPTICAL ELEMENTS FROM CUBIC MATERIALS.

FIELD OF THE INVENTION

The present invention relates generally to short wavelength optical systems and elements for use therein, optical projection lithography methods and photolithography, and particularly to optical photolithography fluoride crystal elements for use in optical photolithography systems and short wavelength optical systems utilizing ultraviolet light (UV) wavelengths below 194 nm, such as UV lithography systems utilizing wavelengths in the 193 nm region and the 157 nm region.

TECHNICAL BACKGROUND

Projection optical photolithography methods/systems that utilize the ultraviolet wavelengths of light below 194 nm provide benefits in terms of achieving smaller feature dimensions. Such methods/systems that utilize ultraviolet wavelengths in the 157 nm and the 193 nm wavelength regions have the potential of improving the manufacturing of integrated circuits with smaller feature sizes but the commercial use and adoption of below 194 nm UV in high volume mass production of integrated circuits has been slow. Part of the slow progression to below 194 nm UV by the semiconductor industry has been due to the lack of economically manufacturable fluoride cubic crystal optical elements with high performance at such short wavelengths. For the benefit of ultraviolet photolithography in the 157 nm region such as the emission spectrum window of a fluorine excimer laser and the 193 nm region such as the ArF excimer laser emission spectrum to be utilized in the manufacturing of integrated circuits there is a need for fluoride crystal optical elements that have beneficial optical properties and that can be designed for and utilized with below 194 nm UV photons. The Argon Fluoride emits at ~193 nm and the Fluorine (F2) excimer emits at ~157 nm, and for various optical applications it is preferable to have such short wavelengths of light less than 194 nm. For use with optical systems with Fluorine (F2) lasers or Argon Fluoride lasers, the preferred crystal material for optical elements has been calcium fluoride, a cubic fluoride crystal.

SUMMARY

The invention includes a method of making a <194 nm wavelength transmitting calcium fluoride crystal optical lithography element for transmitting wavelengths less than about 194 nm along an optical axis with minimal intrinsic birefringence. The method includes providing an optical element calcium fluoride crystal with an input face {100} crystal plane and forming said input face {100} crystal plane into an optical lithography element surface of an optical lithography element having an optical axis, with the optical axis aligned with a <100> crystal direction of the calcium fluoride crystal.

The invention includes a <194 nm wavelength transmitting calcium fluoride crystal optical lithography element for transmitting wavelengths less than 194 nm with minimal intrinsic birefringence. The optical lithography element is comprised of an optical calcium fluoride crystal with a {100} crystal plane and a <100> crystal direction with the optical element having an optical axis aligned with the <100> calcium fluoride crystal direction.

The invention includes a method of making a fluoride crystal optical element for transmitting short wavelengths of light (<194 nm) along an optical axis with minimal intrinsic birefringence. The method includes providing an optical element optical fluoride crystal with an input face {100} crystal plane and forming the input face {100} crystal plane into an optical element surface of an optical element having an optical axis with the optical axis aligned with a <100> crystal direction of the optical fluoride crystal.

The invention includes an optical element for transmitting wavelengths less than about 194 nm with minimal intrinsic birefringence. The optical element is comprised of a cubic optical fluoride crystal with a {100} crystal plane and a <100> crystal direction with the optical element having an optical axis aligned with the <100> crystal direction.

The invention includes a below 194 nm wavelength transmitting lens with minimal intrinsic birefringence comprised of a cubic optical fluoride crystal with a {100} crystal plane and a <100> crystal direction. The lens has a curved optical surface and an optical axis aligned with the <100> crystal direction and normal to the {100} crystal plane.

The invention includes a below 194 nm wavelength transmitting beam splitter cube with minimal intrinsic birefringence. The beam splitter cube is comprised of a cubic optical fluoride crystal with a {100} crystal plane and a <100> crystal direction with the beam splitter cube face parallel to the {100} crystal plane and an optical axis aligned with the <100> crystal direction.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitute a part of this specification. The drawings illustrate one or more embodiment(s) of the invention, and together with the description serve to explain the principles and operation of the invention.

DETAILED DESCRIPTION

Figure 1:
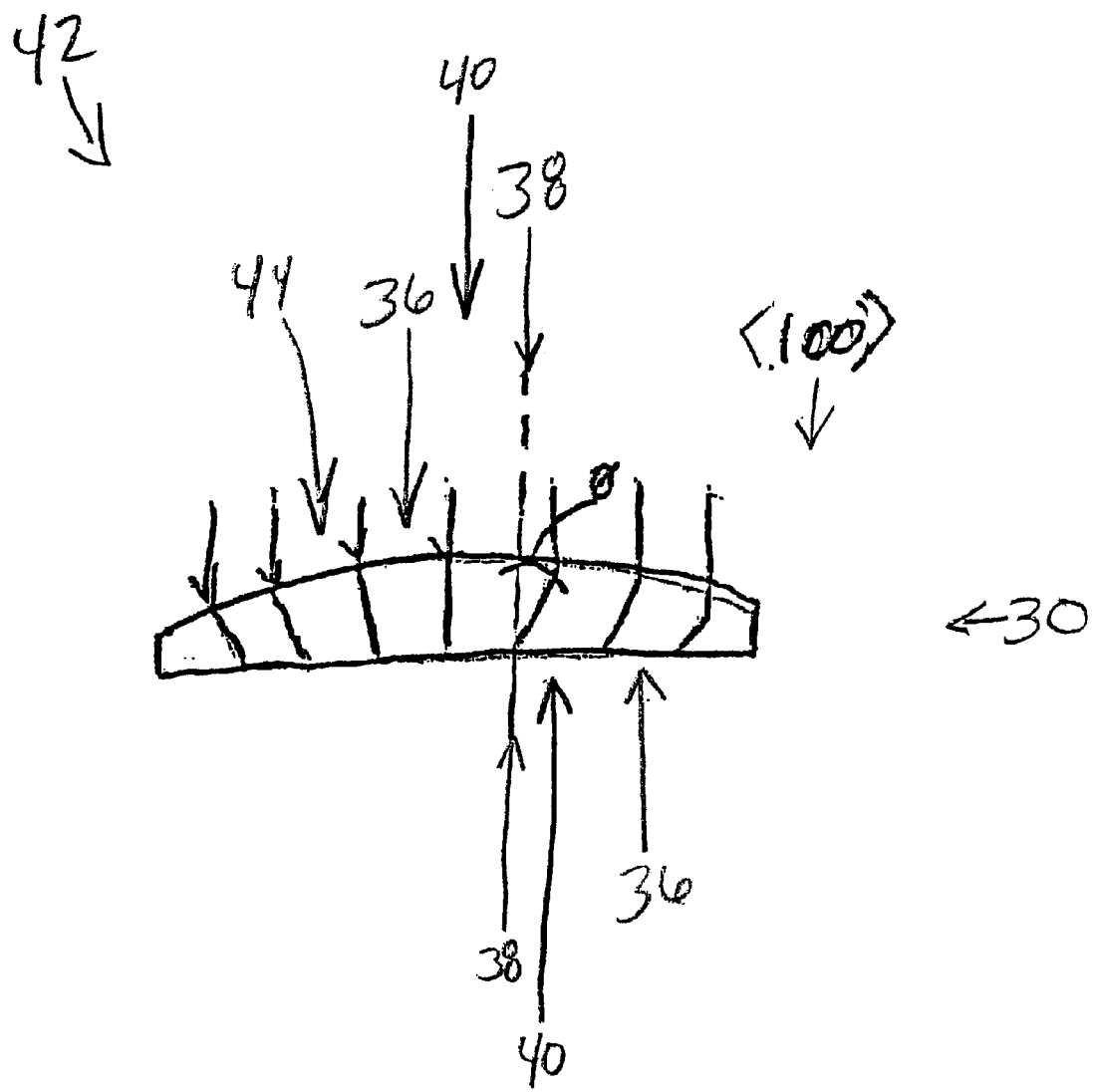
FIGS. 1, 1(a) and 1(b) show an embodiment of the invention with a <100> crystal direction oriented fluoride crystal lens element.
Figure 1A:
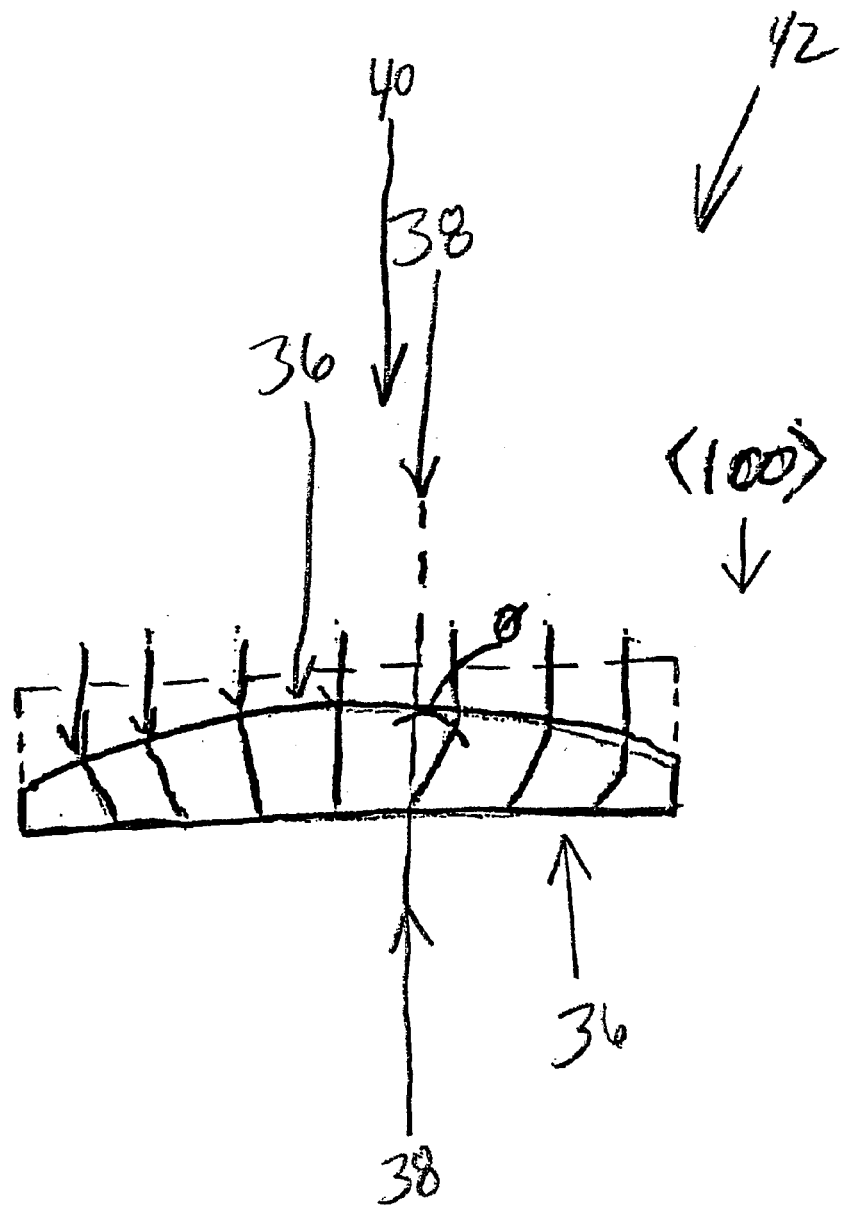
Figure 1B:
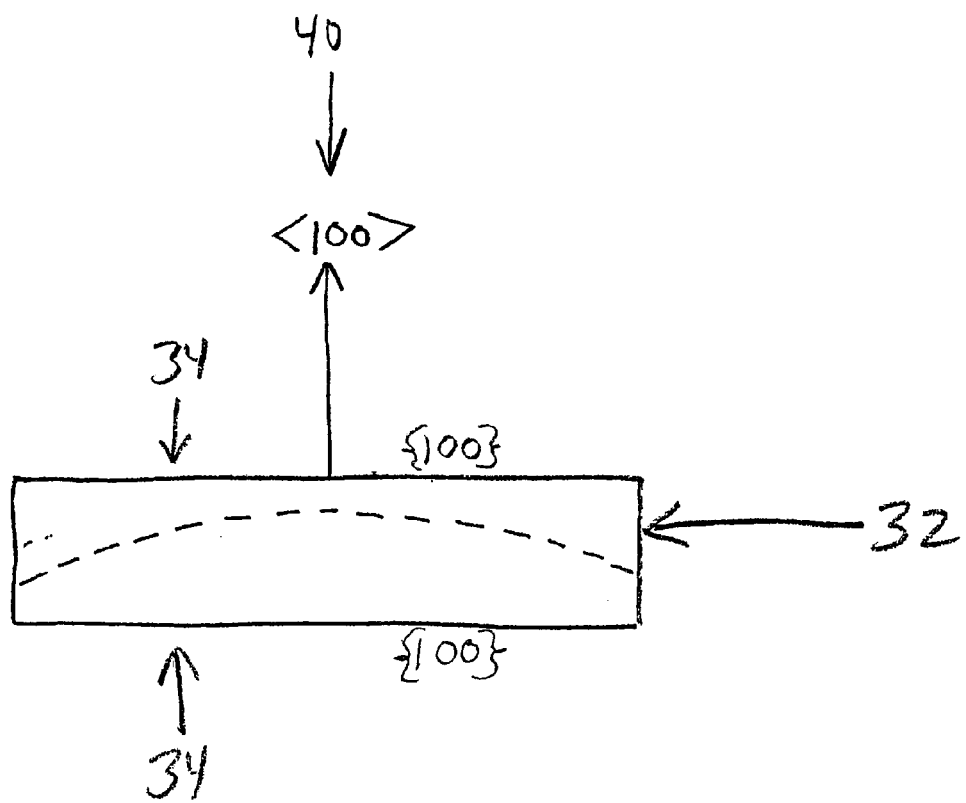

The invention includes a method of making a <194 nm wavelength transmitting calcium fluoride crystal optical lithography element 30 for transmitting wavelengths less than about 194 nm, such as 193 nm or 157 nm, along an optical axis with minimal birefringence. The method includes providing an optical element optical calcium fluoride crystal 32 with an input face {100} crystal plane 34. The method includes forming the input face {100} crystal plane 34 into an optical lithography element surface 36 of the optical lithography element 30 having an optical axis 38 with the optical axis 38 aligned with a <100> crystal direction 40 of the optical calcium fluoride crystal 32. In an embodiment, forming includes forming the calcium fluoride crystal 32 into a lens element 42 with a curved optical element surface 44. The formed lens element 42 having a lens optical axis 38 aligned with a <100> crystal direction 40 of the calcium fluoride crystal and normal to the {100} calcium fluoride crystal plane 34. In an embodiment, forming includes forming the optical calcium fluoride crystal 32 into a beam splitter cube 46 with a beam splitter cube face 48 parallel to the {100} calcium fluoride crystal plane 34 and a beam splitter optical axis 38 aligned with a <100> crystal direction 40 of crystal 32.

The invention includes a <194 nm wavelength calcium fluoride crystal optical lithography element 30 for transmitting wavelengths less than 194 nm with minimal intrinsic birefringence. The optical lithography element 30 is comprised of an optical calcium fluoride crystal 32 with a {100} crystal plane 34 and a <100> crystal direction 40. The optical element has an optical axis 38 aligned with the <100> calcium fluoride crystal direction 40. The optical element surface of the element is preferably normal to the optical axis 38, with the optical surface formed in alignment with the crystals {100} crystal plane. In an embodiment the calcium fluoride crystal optical element is a lens. In an embodiment the calcium fluoride crystal optical element is a beam splitter.

The invention includes a method of making a fluoride crystal optical element for transmitting wavelengths less than about 194 nm along an optical axis with minimal birefringence. Preferably the method includes making a cubic fluoride crystal optical lithography element for lithography systems that operate at less than 194 nm, such as 193 wavelengths or 157 nm wavelengths. The method includes providing an optical element optical fluoride crystal 32 with an input face {100} crystal plane 34 and forming the face {100} plane into an optical element surface 36 of an optical element 30 having an optical axis 38 aligned with a <100> crystal direction 40 of the optical fluoride crystal 32. In an embodiment, forming includes forming the optical fluoride crystal 32 into a lens element 42 with a curved optical element surface 44, with the lens element 42 having a lens optical axis 38 aligned with a <100> crystal direction 40 of crystal 32 and normal to the {100} crystal plane 34 of crystal 32. In a preferred embodiment crystal 32 is formed into a lens element 42 for directing a cone of light rays having a cone angle θ of at least 35.26°. In another embodiment, crystal 32 is formed into a beam splitter cube 46 with a beam splitter cube face 48 parallel to the {100} crystal plane 34 and a beam splitter optical axis 38 aligned with a <100> crystal direction 40 of crystal 32. In a preferred embodiment the crystal 32 is formed into a beam splitter cube for use with a curved mirror to deliver a polarized light having a <194 nm wavelength, with incoming light rays incident at an angle onto the cube. In a preferred embodiment the crystal 32 is formed into an interferometry beam splitter cube for use below 194 nm light rays, with light rays travelling along the optical axis in alignment with the <100> directions ([100], [010], [001]) of crystal 32. In a preferred embodiment crystal 32 is formed into an optical element 30 with minimized intrinsic birefringence with element for use in below 194 nm optical applications when light through the optical element is not perpendicular to the {100} crystal planes. In an embodiment optical fluoride crystal 32 is comprised of calcium, preferably comprised of calcium fluoride and most preferably consists essentially of $CaF_2$ with a below 194 nm internal transmission of at least 99%/cm. In an embodiment optical fluoride crystal 32 is comprised of barium, preferably comprised of barium fluoride, and most preferably consists essentially of $BaF_2$ with a below 194 nm internal transmission of at least 99%/cm. In an embodiment optical fluoride crystal 32 is comprised of strontium, preferably comprised of strontium fluoride, and most preferably consists essentially of $SrF_2$ with a below 194 nm internal transmission of at least 99%/cm.

The invention includes an optical element for transmitting wavelengths less than about 194 nm with minimal intrinsic birefringence. The optical element in comprised of a cubic optical fluoride crystal with a {100} crystal plane and a <100> crystal direction with the optical element having an optical axis aligned with the <100> crystal direction. In a preferred embodiment, the element is a below 194 nm lithography element for transmitting a below 194 nm lithography wavelength such as a 193 nm wavelength or a 157 nm wavelength in an optical lithography system. The optical element 30 transmits below 194 nm light along an optical axis 38. The optical element 30 is comprised of a cubic optical fluoride crystal 32 with a {100} crystal plane 34 and a <100> crystal direction 40, with the optical axis 38 aligned with a <100> crystal direction 40 and normal to a {100} crystal plane 34. The optical element 30 has an optical element surface 36 that is aligned with a {100} crystal plane and normal to a <100> crystal direction optical axis of the element. In an embodiment the optical fluoride crystal 32 of element 30 is comprised of calcium, preferably calcium fluoride, and most preferably the crystal consists essentially of $CaF_2$ with a below 194 nm internal transmission of at least 99%/cm. In an embodiment the optical fluoride crystal 32 of element 30 is comprised of barium, preferably barium fluoride, and most preferably the crystal consists essentially of $BaF_2$ with a below 194 nm internal transmission of at least 99%/cm. In an embodiment the optical fluoride crystal 32 of element 30 is comprised of strontium, preferably strontium fluoride and most preferably the crystal consists essentially of $SrF_2$ with a below 194 nm internal transmission of at least 99%/cm. In an embodiment optical element 30 is a lens element with a curved optical surface and a lens optical axis 38 aligned with the <100> crystal direction. Preferably the lens element has a cone angle θ for a cone of light rays with the cone angle at least 35.26°, with the light rays not perpendicular to the {100} crystal planes. In an embodiment optical element 30 is a beam splitter cube with a beam splitter cube face 48 parallel to the {100} crystal plane and a beam splitter optical axis aligned with the <100> crystal direction. In a preferred embodiment the beam splitter cube is a lithography element for use with the curved mirror to deliver a polarized light having a <194 nm wavelength, preferably with incoming light rays incident at an angle onto the cube. In a preferred embodiment, the beam splitter cube is an interferometry beam splitter cube for use with below 194 nm light rays with light rays travelling along the optical axis in alignment with the <100> crystal directions. The optical element 30 provides for minimized intrinsic birefringence at short wavelengths below 194 nm.

The invention includes a below 194 nm wavelength transmitting lens 42 comprised of a cubic optical fluoride crystal with a {100} crystal plane and a <100> crystal direction with the lens having a curved optical surface 44 and an optical axis 38. The lens optical axis 38 is aligned with the <100> crystal direction and normal to the {100} crystal plane. In a preferred embodiment the below 194 nm transmitting lens optical fluoride crystal is comprised of calcium, preferably calcium fluoride and most preferably consists essentially of $CaF_2$ with a below 194 nm internal transmission of at least 99%/cm. In an embodiment the below 194 nm transmitting lens optical fluoride crystal is comprised of barium, preferably barium fluoride, most preferably the crystal consists essentially of $BaF_2$ with a below 194 nm internal transmission of at least 99%/cm. In an embodiment the below 194 nm transmitting lens optical fluoride crystal is comprised of strontium, preferably strontium fluoride crystal, and most preferably the crystal consists essentially of $SrF_2$ with a below 194 nm internal transmission of at least 99%/cm. Preferably the lens element has a cone angle θ for a cone of light rays with the cone angle at least 35.26°. Preferably the optical element crystal lens provides for minimized intrinsic birefringence at short wavelength light rays below 194 nm that are non perpendicular to the {100} crystal plane 34.

The invention includes a below 194 nm wavelength transmitting beam splitter cube 46 comprised of a cubic optical fluoride crystal with a {100} crystal plane and a <100> crystal direction with the beam splitter cube having a beam splitter cube face 48 parallel to the {100} crystal plane and having a beam splitter optical axis aligned with the <100> crystal direction. In a preferred embodiment the below 194 nm beam splitter cube optical fluoride cubic crystal is comprised of calcium, preferably calcium fluoride, and most preferably the cubic crystal consists essentially of $CaF_2$ with a below 194 nm internal transmission of at least 99%/cm. In an embodiment the below 194 nm beam splitter cube optical fluoride cubic crystal is comprised of barium, preferably barium fluoride and most preferably consists essentially of $BaF_2$ with a below 194 nm internal transmission of at least 99%/cm. In an embodiment the below 194 nm beam splitter cube optical fluoride cubic crystal is comprised of strontium, preferably strontium fluoride and most preferably consists essentially of $SrF_2$ with a below 194 nm internal transmission of at least 99%/cm. In a preferred embodiment the beam splitter cube 46 is a lithography element for use with lithography wavelengths such as 193 or 157 nm. Preferably the lithography element beam splitter is for use with a curved mirror to deliver a polarized light having a <194 nm wavelength preferably with incoming light rays incident at an angle onto a cube face 48. In a preferred embodiment the beam splitter cube 46 is a interferometry optical element for use with below 194 nm light rays with light rays travelling along the axis aligned with a <100> direction of the crystal. The beam splitter cube optical element 46 provides for minimizing intrinsic birefringence at short wavelengths below 194 nm by utilizing the <100> crystal directions of the cubic fluoride crystal 32.

Up until now the concern with cubic crystals with respect to birefringence has been related to that associated with stress birefringence, as a consequence of the growth process. This has pointed to a preferred direction for use the crystals with the incident plane being {111}, the plane where the effect of the stress birefringence is minimized.

However there is an intrinsic birefringence in cubic crystals that has not been considered. This birefringence has nothing to do with stress. The intrinsic birefringence becomes comparable to the stress birefringence at shorter wavelengths. Intuition suggests that cubic crystalline materials, such as $CaF_2$ or $BaF_2$, are optically isotropic. In other words, the index of refraction or dielectric tensor is the same for light propagation in any arbitrary direction. In this way, cubic crystals resemble glasses, with isotropic optical properties. For cubic crystals it turns out that this picture is only valid in the limit in which the light wavelength is very long compared with interatomic dimensions. As the material is used at shorter wavelengths additional contributions to the optical response are no longer negligible. These additional contributions create a directionally dependent index of refraction, i.e. intrinsic birefringence. It is important to note that this birefringence is not stress-related birefringence. It is an intrinsic property of any cubic crystal and is not removable by annealing.

It is shown that this intrinsic birefringence vanishes for light propagating in the symmetry directions <111> or <100>, but reaches its maximum value for light going in the <110> directions.

It has been the practice to fabricate optics of $CaF_2$ by using the {111} crystal plane to form the input face of the optic. The fabrication of an optic where light will be propagating through it in directions other than normal to the {111} plane (or equivalently high symmetry directions) presents a case where the intrinsic birefringence described here could be an issue.

Three examples are shown in the attached FIGS. The first two examples are related to imaging applications at short wavelengths. The first case is where the optic itself has curvature (FIG. 1). Consider an example case that includes a cone of light rays at an angle θ of at least cos-1 (⅔^½)= 35.26 degrees. In that cone <110> directions are included and peak birefringence should be observed at several locations. Of the 12 equivalent <110> directions only 3 lie within less than 90 degrees of [111]. These are [110], [101] and [011]. Since the cone of light includes these three directions, three equivalent peaks in birefringence should be observed 120 degrees apart in the transmitted intensity. If one considers a similar case except now using the {100} plane as the incident face, it can be shown that the cone of incidence sweeps a larger angle for the same birefringence. Alternatively expressed, the same cone angle has less birefringence when the {100} plane is used.

Figure 2:
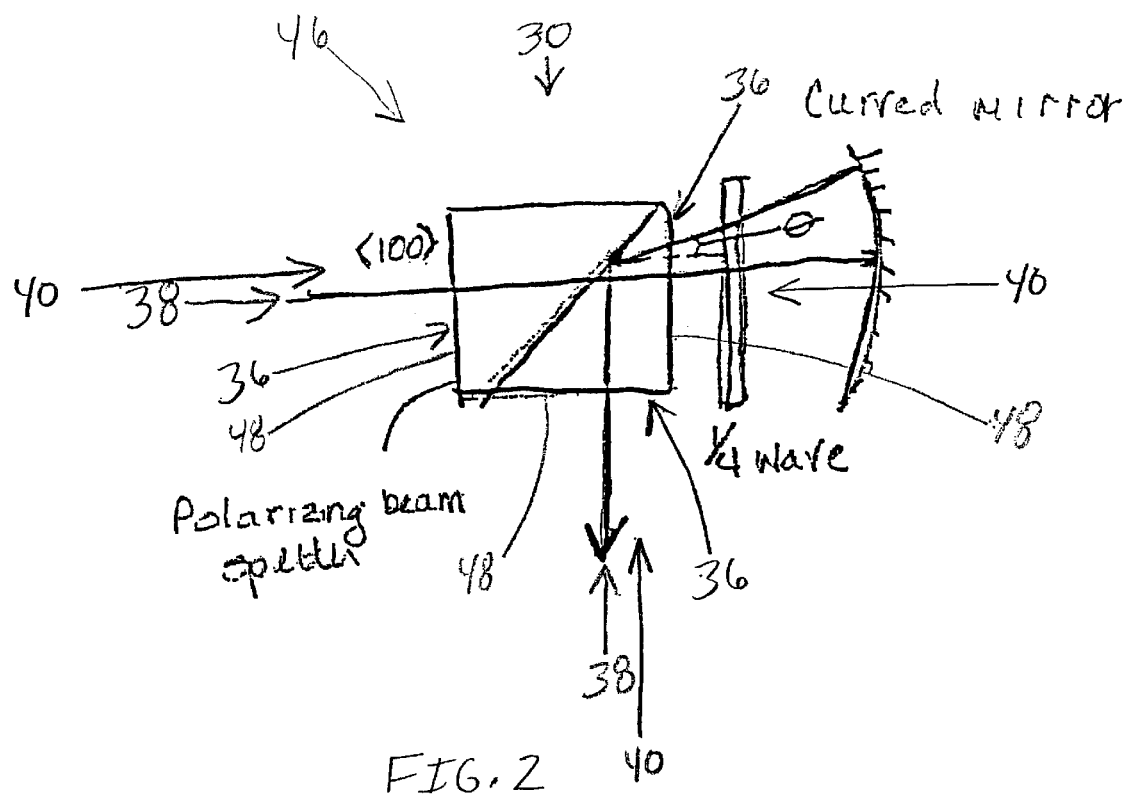
FIGS. 2 and 2(a) show an embodiment of the invention with a <100> crystal direction oriented fluoride crystal beam splitter element.
Figure 2A:
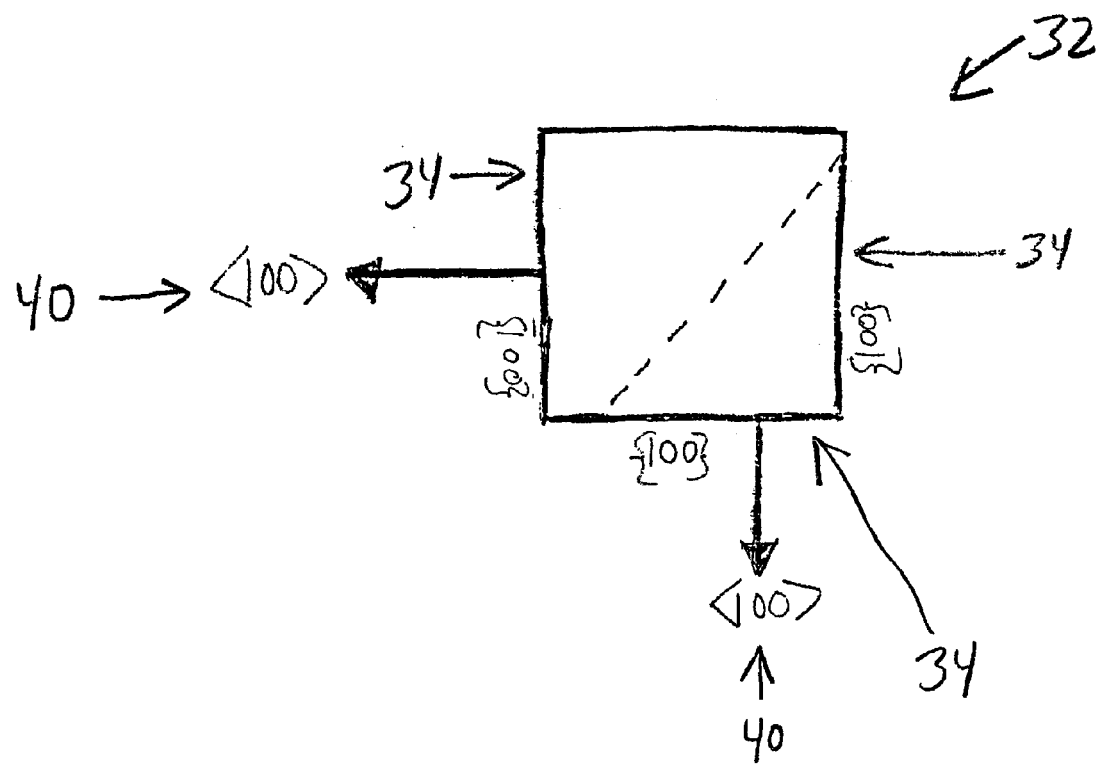

The second example is where one would use a curved mirror in association with a flat cube beam splitter (FIG. 2) to deliver polarized light. A quarter wave plate is also included in this design. In this case, due to the reflection from the curved mirror, the incoming rays are incident at an angle onto the cube. This is a related situation to that shown in FIG. 1 and here again the {100} face should offer an advantage in minimizing inherent birefringence.

Figure 3:
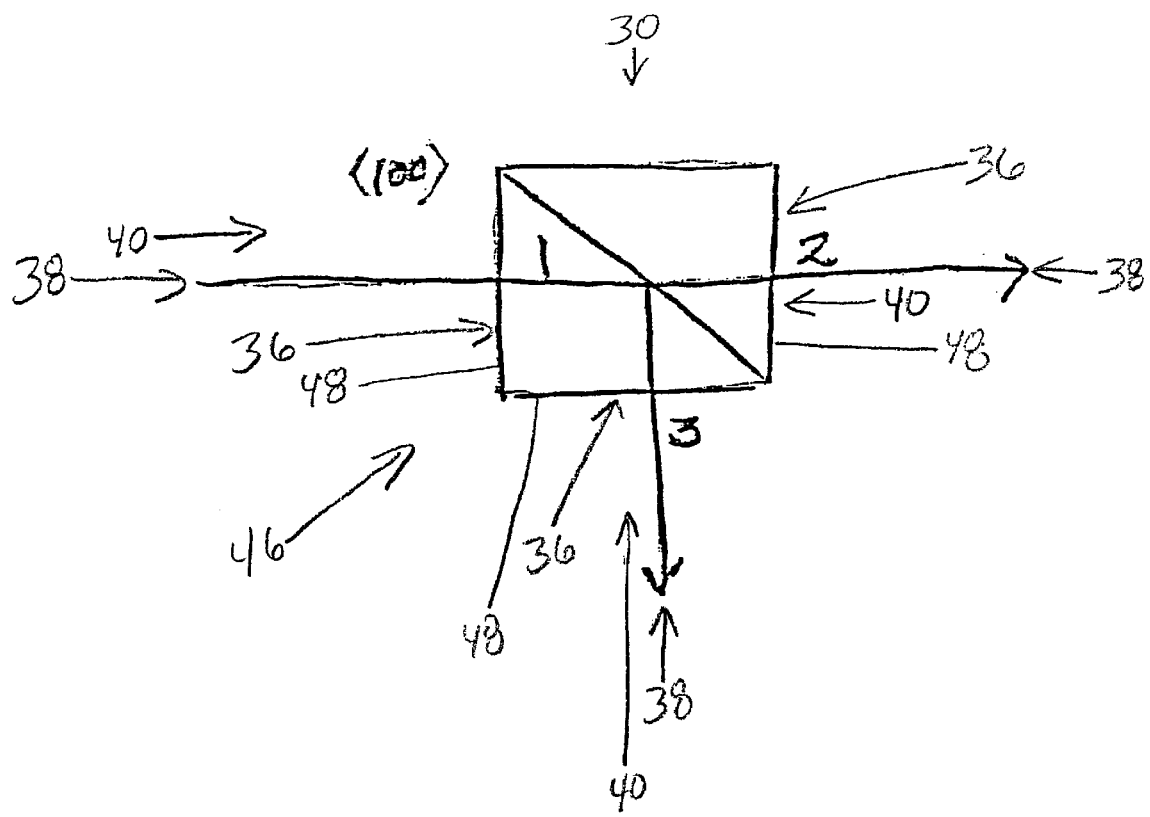
FIGS. 3 and 3(a) show an embodiment of the invention with a <100> crystal direction oriented fluoride crystal beam splitter element.
Figure 3A:
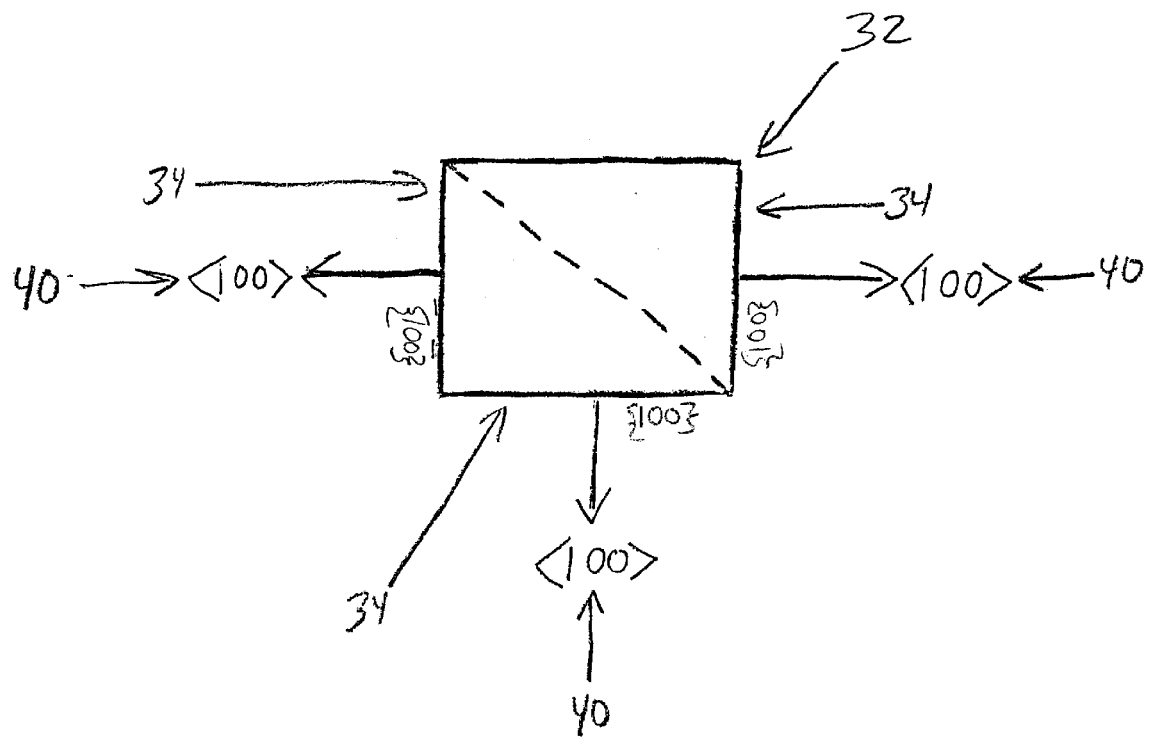

Finally, interferometry applications that utilize calcium fluoride would also benefit from the recognition of the utility of the {100} plane. A schematic of this is shown in FIG. 3. If ray 1 travels in the <111> direction, then it experiences no intrinsic birefringence. However, in this case, ray 3 must travel in one of the <110> directions because these are at right angles to the <111> direction, experiencing maximum intrinsic birefringence.

Alternatively, if ray 1 travels in the <100> direction of the crystal, then ray 3 can travel in the <010> direction. Both of these directions have zero intrinsic birefringence. This approach would negate the use of a waveplate in the interferometer design.

The relevance of using the orientation that minimizes the amount of intrinsic birefringence encountered is in applications where wavefront integrity is critical. That would include short wavelength lithography and interferometry functions.

Intrinsic birefringence is zero in the {111} and {100} planes of cubic crystals and maximized in the {110} plane. It is proposed that the {100} plane is preferable for minimizing the effects of inherent birefringence, particularly when light through the optic is not perpendicular to the crystal plane.

FIG. 4 illustrates the cubic crystal structure of $CaF_2$. $BaF_2$ and $SrF_2$ have a similar cubic crystal structure. The crystal structure of $MgF_2$ is tetragonal, which is similar to the cubic structure of $CaF_2$. The tetragonal structure differs from the cubic in that the distance between the $M^{+2}$ along the z-axis in the tetragonal structure is not equal to the distance along the x- and y-axes, wherein in the cubic structure it is. In both structure the angles between the x-, y- and z-axes is 90°. Consequently, determining the {100} plane and <100> direction as described be similar for all the foregoing species. FIG. 5 illustrates the {100}plane (shaded) and associated <100> direction normal to this plane.

In FIG. 3, with the cube beam splitter, light enters along path 1 and is split into paths 2 and 3 with equal path length through material. Intrinsic birefringence is zero in the <111> directions and zero in <111> and <100> directions. To avoid the effects of the naturally occurring birefringence, we fabricate a cubic optic such that the {100} face (or equivalent) of the crystal is the input face of the optic. In this case, ray 3 shown in FIG. 3 will emerge from the {010} face or equivalent of {100}. Thus the incident, transmitted, and reflected rays of FIG. 3 will experience no intrinsic birefringence.

This describes a simple physical picture of intrinsic birefringence of $CaF_2$ and other cubic crystals and also mathematical analysis of an intrinsic birefringence in cubic crystals that is only observable at short wavelength.

Ordinarily, cubic crystals such as $CaF_2$ are considered to have negligible intrinsic birefringence because of their cubic symmetry. (We are not considering birefringence induced by residual stresses.) However, as the light wavelength decreases, light waves experience a slightly different environment for different directions of propagation. Quantitatively, this effect is manifested as an additional symmetry-breaking term giving rise to intrinsic birefringence that is proportional to the inverse square of wavelength. This level of birefringence can be detrimental to optical performance at 157 nm and 193 nm.

The symmetry-breaking term proportional to $1/\lambda^2$, discussed is expected to occur in cubic systems from fundamental principles. Likewise, this term is absent from completely isotropic materials like glasses. The intrinsic birefringence vanishes for certain high symmetry directions of propagation, like <111> and <100>, and reaches it maximum value for the in-between directions <110>. Thus, for example, light traveling down a typical optic axis in the <111> direction will experience no intrinsic birefringence.

There is a rough estimate of the size of the intrinsic value, due to H. A. Lorentz, Collected Papers III, page 314:

$$\Delta n = 0.44\pi n(n^2-1)^2(a/\lambda)^2 \tag{0.1}$$

where $\Delta n$ is the birefringence, n is the index of refraction, "a" is a characteristic length that may be taken as a typical bond length, and $\lambda$ is the wavelength of light. To get an estimate for $\lambda=147$ nm, take a literature value of $n=1.589$ and a bond length of 0.2365 nm for $CaF_2$ to get $\lambda n=13\times10^{-6}$ or 130 nm/cm. The Lorentz estimate is believed to be on the high side by about a factor of 5. Consider this a very rough approximation with the correct $1/\lambda^2$ dependence.

To appreciate why the effect is largest in <110> directions and vanishes in <100> and <111> directions, it suffices to consider the symmetries of a cube. If you look down an x, y, or z axis of a cube (i.e. <100> direction), you find that a 4-fold rotation carries the cube back into coincidence. Similarly, if you look down a body diagonal (i.e. <111> direction), you find a 3-fold symmetry rotation. Either of these symmetry rotations is enough to mix the components of any two-dimensional vector lying in the plane perpendicular to the rotation axis, destroying any birefringence for light waves traveling straight down either axis. If you look down the cube in a <110> direction (e.g. looking down a line that runs across a cube face), you see an obviously rectangular symmetry that has only a 2-fold rotational symmetry. A 2-fold rotation does not mix vector components, so birefringence is possible. This turns out to be the direction of highest birefringence.

Before jumping into the mathematics, consider one more picture for light cone birefringence. With a cone of light whose average direction is <111>; if the cone includes rays at an angle of at least $$\cos^{-1}\left(\frac{2}{\sqrt{6}}\right) = 35.26°$$

(designs can reach 42° in the $CaF_2$), then <110> directions are included and peak birefringence should be observed at several locations. Of the 12 equivalent <110> directions, only three lie within less than 90° of <111>. These are [110], [101], and [011]. Since the cone of light includes these three directions, three equivalent peaks in birefringence should be observed 120° apart in the transmitted intensity.

This section of mathematical details starts with the fundamental expression for the dielectric tensor, that is derivable from first principles, and derives several important expressions and results. This section is important to prove the vanishing of the intrinsic birefringence along <100> and <111>, to show the vanishing of the intrinsic birefringence in isotropic materials (a kind of check on the algebra), and to show the nonzero result for the <110> directions. For light in the <110> direction, the detailed analysis also provides the directions of the principal optic axes.

The general expression for the dielectric tensor, including nonzero photon wavevector $\vec{q}$, is $$\epsilon_{\mu\nu}(\vec{q})=\epsilon_{\mu\nu}(\vec{q}=0)+R_{\mu\nu ij}q_iq_j \tag{0.2}$$

where $R_{\mu\nu ij}$ is a new rank 4 tensor that accounts for the influence of nonzero wavevector on $\epsilon$. This expression is derivable from fundamental quantum mechanics for optical response. Most conventional derivations take the $\vec{q}\to0$ limit because that is usually a very good approximation. To preserve a close analogy to the rank 4 elasto-optical or photoelastic tensor $p_{ijkl}$ relating strain and index change, we define the q-dependent index change as $$\Delta B_{\mu\nu}=P_{\mu\nu ij}q_iq_j \tag{0.3}$$

where $\Delta B_{\mu\nu}$ is the change of the relative dielectric impermeability tensor $B_{ij}$ from its q=0 value. ($B_{ij}$ and related tensors are defined and discussed on page 243 of J. F. Nye, *Physical Properties of Crystals*. $B_{ij}$ is the inverse of the dielectric tensor.) The tensor $P_{\mu\nu ji}$ we define here may or may not be defined the same way so a careful comparison is needed when working with actual values. In a cubic crystal system, a rank 4 tensor has only three unique nonzero components. Using a contracted notation (see J. F. Nye, *Physical Properties of Crystals*, near page 248), these components are $P_{1111} \rightarrow P_{11}$ $P_{1122} \rightarrow P_{12}$ (0.4)

$P_{1212} \rightarrow P_{44}$ or $P_{11}$, $P_{12}$, and $P_{44}$. Note that the same three tensor components fully characterize the photoelastic response of a cubic material (a different tensor, of course, but with the same transformation properties). The dyad formed by $\vec{q}\vec{q}$ has to be modified to conform to the contracted index notation. The 3×3 tensor (dyad) representing $\vec{q}\vec{q}$ is replaced by a column vector with 6 components $$\vec{Q} = \begin{bmatrix} q_1 q_1 \\ q_2 q_2 \\ q_3 q_3 \\ 2q_2 q_3 \\ 2q_1 q_3 \\ 2q_1 q_2 \end{bmatrix}.$$ (0.5)

The factors of 2 are needed to make the contracted index products reproduce the messier index summations of the original rank 4 tensor. Using these definitions, Eq.(0.3) can be rewritten $B_{11}(\vec{q}) = B_{11}(0) + P_{11}q_1^2 + P_{12}(q_2^2 + q_3^2)$ $B_{22}(\vec{q}) = B_{22}(0) + P_{11}q_2^2 + P_{12}(q_1^2 + q_3^2)$ $b_{33}(\vec{q}) = B_{33}(0) + P_{11}q_3^2 + P_{12}(1_1^2 + q_2^2)$ (0.6)

$B_{32}(\vec{q}) = 2P_{44}q_2 q_3$ $B_{31}(\vec{q}) = 2P_{44}q_1 q_3$ $B_{21}(\vec{q}) = 2P_{44}q_1 q_2$ Given measured or theoretically calculated values for the three constants $P_{11}$, $P_{12}$, and $P_{44}$, Eq.(0.6) shows exactly how the dielectric impermeability tensor components are modified at short wavelength in a cubic system. Further analysis requires that we specify some given direction for the photon wavevector $\vec{q}$ so that we know the components $q_1$, $q_2$, and $q_3$. (Note that different definitions of the P tensor are possible. The definitions should be checked carefully before comparing results.) The dielectric impermeability tensor is used to define the index ellipsoid or optical indicatrix by the expression $B_{ij}x_i x_j = 1$. (0.7)

Thus, small changes in $B_{ij}$ give rise to changes in index of refraction (including birefringence) and changes in the principal index axes (the eigenvectors of B). For a cubic crystal (in the $\vec{q}=0$ limit), the impermeability tensor is diagonal and has three identical eigenvalues, which are $(1/n^2)$ for index of refraction n. Thus $B_{11}(0)$, $B_{22}(0)$, and $B_{33}(0)$ for our cubic system are each $(1/n^2)$.

We expect birefringence along [100] to vanish according to arguments given above, but as a check, we apply Eq.(0.6) for $\vec{q}=(q,0,0)$. Then the dielectric impermeability tensor components become $B_{11}(\vec{q}) = 1/n^2 + P_{11}q^2$ $B_{22}(\vec{q}) = 1/n_2 + P_{12}q^2$ $B_{33}(\vec{q}) = 1/n^2 + P_{12}q^2$ (0.8)

$B_{32}(\vec{q}) = 0$ $B_{31}(\vec{q}) = 0$ $B_{21}(\vec{q}) = 0$

Note that the dielectric impermeability tensor for this case is still diagonal, but no longer has the same value for each element on the diagonal. However, since light is a transverse wave, only the $B_{22}$ and $B_{33}$ components are relevant for our case of light traveling in the [100] direction. For this simple case there are two equal eigenvalues that correspond to any polarizations perpendicular to [100]. Intrinsic birefringence is the difference between these two equal values, i.e. zero. Even though the birefringence vanishes, the actual index of refraction is altered slightly by this term. The altered index of refraction is given by the expression $$\Delta n = -\frac{1}{2}n^3 \Delta B = -\frac{1}{2}n^3 P_{12}q^2.$$ (0.9)

(See Nye again, page 252.) It will turn out that the index of refraction, whether birefringent or not, can be modified by terms of order 1 ppm for light propagation in different directions in the cubic crystal. Such intrinsic variation in the index of refraction should be accounted for in lens design modeling, in addition to the intrinsic birefringence.

The <111> Case

As for <100>, we have given a symmetry argument for the vanishing of the birefringence for light propagation down the <111>axis. Nevertheless, it is instructive to go through the algebra and demonstrate this. Consider a wavevector $\vec{q}=(q,q,q)/\sqrt{3}$. The normalization is chosen so that the magnitude is q and not $\sqrt{3}q$. The dielectric impermeability tensor components become $B_{11}(\vec{q}) = 1/n^2 + q^2(P_{11}+2P_{12})/3$ $B_{22}(\vec{q}) = 1/n^2 + q^2(P_{11}+2P_{12})/3$ $B_{33}(\vec{q}) = 1/n^2 + q^2(P_{11}+2P_{12})/3$ $B_{32}(\vec{q}) = 2P_{44}q^2/3$ $B_{31}(\vec{q}) = 2P_{44}q^2/3$ $B_{21}(\vec{q}) = 2P_{44}q^2/3$ Now the dielectric impermeability tensor is not diagonal, so it is not as obvious what the indices of refraction are for different polarizations and the related birefringence. What is needed are the eigenvectors and eigenvalues of the dielectric impermeability tensor, giving the principal axes and principal indices of refraction (after some manipulation). The dielectric impermeability tensor has the form of a 3×3 matrix $$\begin{bmatrix} a & b & b \\ b & a & b \\ b & b & a \end{bmatrix}.$$ (0.11)

This matrix has one eigenvalue of $(a+2b)$, with eigenvector $(1,1,1)/\sqrt{3}$, and two degenerate eigenvalues of $(a-b)$, with eigenvectors of $(-1,1,0)/\sqrt{2}$ and $(-1,0,1)/\sqrt{2}$. (Because the two eigenvalues are the same, any linear combination of these eigenvectors is also an eigenvector.) The first principal axis is along the propagation direction, so is irrelevant. The second two are possible principal axes of polarization, but again they do not produce birefringence because the eigenvalues (and indices of refraction) are the same. As in the {100} case, the actual index of refraction is slightly modified, this time to the value $$\Delta n = -\frac{1}{2}n^3 \Delta B = -\frac{1}{2}n^3(P_{11} + 2P_{12} - 2P_{44})q^2/3, \quad (0.12)$$

but the intrinsic birefringence is zero.

The <110> Case

We have argued from symmetry that the intrinsic birefringence will not vanish for the <110> direction.

The algebraic proof that follows also gives a quantitative expression for the intrinsic birefringence. Consider a photon wavevector of $\vec{q}=(1,1,0)/\sqrt{2}$. The dielectric impermeability tensor becomes $$B_{11}(\vec{q})=1/n^2+q^2(P_{11}+P_{12})/2$$

$$B_{22}(\vec{q})=1/n^2+q^2(P_{11}+P_{12})/2$$

$$B_{33}(\vec{q})=1/n^2+q^2P_{12} \quad (0.13)$$

$$B_{32}(\vec{q})=0$$

$$B_{31}(\vec{q})=0$$

$$B_{21}(\vec{q})=q^2P_{44}$$

The dielectric impermeability tensor is a 3×3 matrix with the form $$\begin{bmatrix} a & c & 0 \\ c & a & 0 \\ 0 & 0 & b \end{bmatrix} \quad (0.14)$$

with eigenvalues and eigenvectors $$(1/n^2+q^2[(P_{11}+P_{12})/2+P_{44}]), (1,1,0)/\sqrt{2}$$

$$(1/n^2+q^2[(P_{11}+P_{12})/2-P_{44}]), (-1,1,0)/\sqrt{2}. \quad (0.15)$$

$$(1/n^2+q^2P_{12}), (0,0,1)$$

Light is traveling the same direction as the first eigenvector, so the second and third represent the principal axes for the index of refraction. Now, finally, we find different values of index to order $q^2$ for polarization along $\{-1,1,0\}$ and $\{0,0,1\}$:

$$\Delta n_{-1,1,0} = -\frac{1}{2}n^3[(P_{11}+P_{12})/2-P_{44}]q^2 \quad (0.16)$$

$$\Delta n_{0,0,1} = -\frac{1}{2}n^3P_{12}q^2.$$

Birefringence for light traveling in the {110} direction has its maximum value at $$BR = \Delta n_{-1,1,0} - \Delta n_{0,0,1} = -\frac{1}{2}n^3[(P_{11}-P_{12})/2-P_{44}]q^2. \quad (0.17)$$

This is a very important equation. It gives the relation between tensor components and the largest intrinsic birefringence.

A glass, or any material that may be considered truly the same (on average) in every direction, has an even higher symmetry than a cubic crystal. In an isotropic material, a rank 4 tensor has only two independent components that may be taken as $P_{11}$ and $P_{12}$. Isotropic materials obey the relation $$P_{44}=(P_{11}-P_{12})/2. \quad (0.18)$$

Since every direction is equivalent, we may consider light propagation in a <110>direction and look for a nonzero birefringence. Then Eq. (0.17) applies, but with Eq.(0.18), we see that BR=0. This had to be so, because we could just have easily considered <100> or <111> directions, where BR=0. Since all directions are equivalent, the intrinsic birefringence must vanish in every direction. This is an important advantage for glasses.

Index of Refraction vs. Direction

Given an index ellipsoid or impermeability tensor $B_{ij}$, it is possible to define the indices of refraction for different polarizations and directions of light propagation. This is the kind of information needed for doing lens design or aberration modeling. The problem is more complicated for intrinsic birefringence, however, because the tensor $B_{ij}$ itself changes for different directions of propagation, as shown above. Equation (0.6) gives all the information, but needs to be manipulated for each choice of directions given by $q_1$, $q_2$, and $q_3$. Some simplifications should be possible. For example, for directions associated with rotating a vector in any plane equivalent to the xy plane, the direction goes through the sequence [100], [110], [010], [110], [100], [110], [010], [110], and then back to [100] again. As these rotations are considered, the birefringence goes from 0 to its peak value given by Eq.(0.17) and back to 0 with 4 cycles, following the expression $$BR = \left(-\frac{1}{2}n^3[(P_{11}-P_{12})/2-P_{44}]q^2\right)\sin(2\theta) \quad (0.19)$$

where θ is the angle from the x-axis. It gets more complicated when the ray direction does not lie in a plane parallel to a cube face.

To estimate the intrinsic contribution to birefringence at various wavelengths, we consider only the direction of largest birefringence and take a value of 6.5 nm/cm at 157 nm. The expression to consider is Eq.(1.17), or $$BR_{peak} = \left(-\frac{1}{2}n^3[(P_{11}-P_{12})/2-P_{44}]q^2\right). \quad (0.20)$$

A Sellmeier expression for index variation of $CaF_2$ gives n(157 nm)=1.5586. To fit BR=6.5 nm/cm, and with q=2π/λ, we deduce $[(P_{11}-P_{12})/2-P_{44}]=0.000214$ nm². We expect these tensor components to have a little dispersion vs. wavelength, presumably getting smaller at longer wavelengths. As a result, the predicted intrinsic birefringence will be a little larger than should actually be observed. Thus, keeping the tensor elements fixed in value from 157 nm but considering dispersion in index and q, the following table may be constructed:

| lambda (nm) | q (1/nm) | n | BR (nm/cm) |
|---|---|---|---|
| 147 | 0.042743 | 1.589 | 7.8 |
| 157 | 0.04002 | 1.5586 | 6.5 |
| 193 | 0.032555 | 1.5015 | 3.8 |
| 248 | 0.025335 | 1.468 | 2.2 |
| 253.65 | 0.024771 | 1.466 | 2.1 |
| 633 | 0.009926 | 1.432882 | 0.3 |

The intrinsic birefringence is 26 times larger at 147 nm than at 633 nm, of which 18 is due to $1/\lambda^2$ and the rest due to q=0 index variation. If these estimates are correct then intrinsic birefringence, viewed in a <110> direction, should be rather small at 633 nm but readily observable at 193 nm. Measured values gives 1.2 nm/cm at 253.65 nm, compared with estimate of 2.1, so the dispersion in the P constants makes the result by 633 nm even smaller.

To exhibit the complexity arising for directions off of <100>, <111>, and <110>, consider a ray direction that stays in the xy plane but runs at some angle (e.g. between {100} and {110}):

$$\vec{q} = (\cos(\theta), \sin(\theta), 0). \quad (0.21)$$

The eigenvectors for this case are not simply along $\vec{q}$ and perpendicular to $\vec{q}$. It is important to point out that the ray direction in this case is not an eigenvector. In all the high symmetry cases considered previously, the ray direction was one of the eigenvectors (principal directions), but this is apparently not the case for a more general wavevector such as Eq.(0.21). In the special case in which we set $P_{44} = (P_{11} - P_{12})/2$, then the ray direction is always an eigenvector with eigenvalue $1/n^2 + P_{11}q^2$ and the other eigenvectors are in the plane perpendicular to this, with degenerate eigenvalues $1/n^2 + P_{12}q^2$. This merely reflects the consequences of being isotropic, as in a glass.

The eigenvalues for wavevector $\vec{q} = (\cos(\theta), \sin(\theta), 0)$ are given by $$1/n_1^2 = 1/n^2 + [(P_{11} + P_{12})/2 + R]q^2 \quad (0.22)$$

$$1/n_2^2 = 1/n^2 + [(P_{11} + P_{12})/2 - R]q^2$$

$$1/n_3^2 = 1/n^2 + P_{12}q^2$$

$$R = \frac{1}{2}[(P_{11} - P_{12})^2 \cos^2(2\theta) + (2P_{44})^2 \sin^2(2\theta)]^{\frac{1}{2}}.$$

This shows the explicit variation of indices of refraction with ray direction, but is hard to use until the in-plane eigenvector is calculated. (The other eigenvector is {001}.)

The invention provides optical elements formed from cubic fluoride crystals such as calcium fluoride, barium fluoride, strontium fluoride, and preferably $CaF_2$, for use in short wavelength optical systems with light wavelengths below 194 nm with the optical elements having a preferred 100 crystal orientation that minimizes intrinsic birefringence related to the short wavelength of the light transmitted through the crystal.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

We claim:

1. A method of making a <194 nm calcium fluoride crystal optical lithography element for transmitting wavelengths less than about 194 nm along an optical axis with minimal birefringence, said method comprising:
   providing an optical element optical calcium fluoride crystal with an input face {100} crystal plane,
   forming said input face {100} crystal plane into an optical lithography element surface of an optical lithography element having an optical axis, said optical axis aligned with a <100> crystal direction of said optical calcium fluoride crystal,
   wherein said optical lithography element having an optical axis aligned with a <100> crystal direction is used in an optical lithography system for transmitting wavelengths <194 nm.

2. A method as claimed in claim 1 wherein forming includes forming said optical calcium fluoride crystal into a lens element with a curved optical element surface, said lens element having a lens optical axis aligned with a <100> crystal direction of said calcium fluoride crystal and normal to said {100} calcium fluoride crystal plane.

3. A method as claimed in claim 1 wherein forming includes forming said optical calcium fluoride crystal into a beam splitter cube with a beam splitter cube face parallel to said {100} calcium fluoride crystal plane and a beam splitter optical axis aligned with a <100> crystal direction of said calcium fluoride crystal.

4. A <194 nm calcium fluoride crystal optical lithography element for transmitting wavelengths less than 194 nm with minimal birefringence, said optical lithography element comprised of an optical calcium fluoride crystal with a {100} crystal plane and a <100> crystal direction, said optical element having an optical axis aligned with said <100> calcium fluoride crystal direction.

5. A method of making a fluoride crystal optical element for transmitting wavelengths less than about 194 nm along an optical axis with minimal birefringence, said method comprising:
   providing an optical element optical fluoride crystal with an input face {100} crystal plane,
   forming said input face {100} crystal plane into an optical element surface of an optical element having an optical axis, said optical axis aligned with a <100> crystal direction of said optical fluoride crystal,
   wherein said fluoride crystal element transmits wavelengths <194 nm along an optical axis aligned with a <100> crystal direction of said optical fluoride crystal.

6. A method as claimed in claim 5 wherein forming includes forming said optical fluoride crystal into a lens element with a curved optical element surface, said lens element having a lens optical axis aligned with a <100> crystal direction of said crystal and normal to said {100} crystal plane.

7. A method as claimed in claim 5 wherein forming includes forming said optical fluoride crystal into a beam splitter cube with a beam splitter cube face parallel to said {100} crystal plane and a beam splitter optical axis aligned with a <100> crystal direction of said crystal.

8. A method as claimed in claim 5 wherein said optical fluoride crystal is comprised of calcium.

9. A method as claimed in claim 5 wherein said optical fluoride crystal is comprised of barium.

10. A method as claimed in claim 5 wherein said optical fluoride crystal is comprised of strontium.

11. An optical element for transmitting wavelengths less than about 194 nm with minimal birefringence, said optical element comprised of a cubic optical fluoride crystal with a {100} crystal plane and a <100> crystal direction, said optical element having an optical axis aligned with said <100> crystal direction,
   wherein said optical element having an optical axis aligned with said <100> crystal direction transmits <194 nm wavelengths.

12. An optical element as claimed in claim 11 wherein said optical fluoride crystal is comprised of calcium.

13. An optical element as claimed in claim 11 wherein said optical fluoride crystal is comprised of barium.

14. An optical element as claimed in claim 11 wherein said optical fluoride crystal is comprised of strontium.

15. An optical element as claimed in claim 11 wherein said optical element is a lens element with a curved optical element surface and a lens optical axis aligned with said <100> crystal direction.

16. An optical element as claimed in claim 11 wherein said optical element is a beam splitter cube with a beam splitter cube face parallel to said {100} crystal plane and a beam splitter optical axis aligned with said <100> crystal direction.

17. A below 194 nm wavelength transmitting lens, said lens comprised of a cubic optical fluoride crystal with a {100} crystal plane and a <100> crystal direction, said lens having a curved optical surface and an optical axis, said optical axis aligned with said <100> crystal direction and normal to said {100} crystal plane,
   wherein said lens having an optical axis aligned with said <100> crystal direction and normal to said {100} crystal plane transmits <194 nm wavelengths.

18. A below 194 nm wavelength transmitting lens in accordance with claim 17, said cubic optical fluoride crystal comprised of calcium.

19. A below 194 nm wavelength transmitting lens in accordance with claim 17, said cubic optical fluoride crystal comprised of barium.

20. A below 194 nm wavelength transmitting lens in accordance with claim 17, said cubic optical fluoride crystal comprised of strontium.

* * * * *